(12) United States Patent
Taylor (10) Patent No.: US 7,176,046 B2
(45) Date of Patent: Feb. 13, 2007

(54) APPARATUS AND A METHOD OF FABRICATING INVERSION CHANNEL DEVICES WITH PRECISION GATE DOPING FOR A MONOLITHIC INTEGRATED CIRCUIT

(75) Inventor: Geoff W. Taylor, Storrs-Mansfield, CT (US)

(73) Assignee: The University of Connecticut, Farmington, CT (US)

( * ) Notice: Subject to any disclaimer, the term of this patent is extended or adjusted under 35 U.S.C. 154(b) by 189 days.

(21) Appl. No.: 11/039,559

(22) Filed: Jan. 20, 2005

(65) Prior Publication Data

US 2005/0121663 A1 Jun. 9, 2005

Related U.S. Application Data

(60) Division of application No. 10/200,967, filed on Jul. 23, 2002, now Pat. No. 6,849,866, and a continuation-in-part of application No. 08/949,504, filed on Oct. 14, 1997, now abandoned.

(60) Provisional application No. 60/028,576, filed on Oct. 16, 1996.

(51) Int. Cl.
   *H01L 21/00* (2006.01)
(52) U.S. Cl. .......................... 438/47; 438/48
(58) Field of Classification Search ............ 438/47–48; 257/183–200
See application file for complete search history.

(56) References Cited

U.S. PATENT DOCUMENTS 3,919,656 A 11/1975 Sokal et al.
4,424,525 A 1/1984 Mimura
4,658,403 A 4/1987 Takiguchi et al.
4,683,484 A 7/1987 Derkits, Jr.

(Continued)

FOREIGN PATENT DOCUMENTS

WO WO-02/071490 9/2002

OTHER PUBLICATIONS

"10-Gb/s High-Speed Monolithically Integrated photoreceiver Using InGaAs p-i-n PD and Planar Doped InAlAs/InGaAs HEMT's" by Akahori et al. IEEE Photonics Technology Letters, vol. 4, No. 7, Jul. 1992.

(Continued)

*Primary Examiner*—Cuong Nguyen
(74) *Attorney, Agent, or Firm*—Gordon & Jacobson, PC (57) ABSTRACT

A family of high speed transistors and optoelectronic devices are obtained on a monolithic substrate by adding two sheets of planar doping together with a wideband cladding layer to the top of a pseudomorphic high electron mobility transistor (PHEMT) structure. The two sheets are of the same polarity which is opposite to the modulation doping of the PHEMT and they are separated by a lightly doped layer of specific thickness. The combination is separated from the PHEMT modulation doping by a specific thickness of undoped material. The charge sheets are thin and highly doped. The top charge sheet achieves low gate contact resistance and the bottom charge sheet defines the capacitance of the field-effect transistor (FET) with respect to the modulation doping layer of the PHEMT. The structure produces a pnp bipolar transistor, enhancement and depletion type FETs, a vertical cavity surface emitting laser, and a resonant cavity detectors.β

6 Claims, 12 Drawing Sheets

U.S. PATENT DOCUMENTS

| | | |
|---|---|---|
| 4,806,997 A | 2/1989 | Simmons et al. |
| 4,814,774 A | 3/1989 | Herczfeld |
| 4,827,320 A | 5/1989 | Morkoc et al. |
| 4,829,272 A | 5/1989 | Kameya |
| 4,899,200 A | 2/1990 | Shur et al. |
| 4,949,350 A | 8/1990 | Jewell et al. |
| 5,010,374 A | 4/1991 | Cooke et al. |
| 5,105,248 A | 4/1992 | Burke et al. |
| 5,202,896 A | 4/1993 | Taylor |
| 5,204,871 A | 4/1993 | Larkins |
| 5,288,659 A | 2/1994 | Koch et al. |
| 5,337,328 A | 8/1994 | Lang et al. |
| 5,349,599 A | 9/1994 | Larkins |
| 5,386,128 A | 1/1995 | Fossum et al. |
| 5,422,501 A | 6/1995 | Bayraktaroglu |
| 5,436,759 A | 7/1995 | Dijaili et al. |
| 5,452,118 A | 9/1995 | Maruska |
| 5,698,900 A | 12/1997 | Bozada et al. |
| 5,999,553 A | 12/1999 | Sun |
| 6,031,243 A | 2/2000 | Taylor |
| 6,043,519 A | 3/2000 | Shealy et al. |
| 6,479,844 B2 | 11/2002 | Taylor |
| 6,628,854 B1 | 9/2003 | Koh et al. |
| 6,720,584 B2 | 4/2004 | Hata et al. |
| 6,849,866 B2 * | 2/2005 | Taylor .................... 257/24 |
| 2002/0054409 A1 | 5/2002 | Bartur et al. |
| 2002/0067877 A1 | 6/2002 | Braun et al. |
| 2003/0007754 A1 | 1/2003 | Terashima |

OTHER PUBLICATIONS

"10-Gbit/s InP-Based High-Performance Monolithic Photoreceivers Consisting of p-i-n Photodiodes and HEMT's" by Takahata et al., IEICE Trans. Electron., vol. E83-C, No. 6 Jun. 2000.

"10 Ghz Bandwidth Monolithic p-i-n Modulation-doped Field Effect Transistor Photoreceiver" by Dutta et al., Appl. Phys. Lett., vol. 63, No. 15, Oct. 11, 1993.

"20 Gbit/s Long Wavelength Monolithic Integrated Photoreceiver Grown on GaAs" by Hurm, et al., Electronics Letters, vol. 33, No. 7, Mar. 27, 1997.

"Monolithic Integrated Optoelectronic Circuits" by Berroth et al., Fraunhofer Institute for Applied Solid State Physics (IAF), Germany, IEEE 1995.

"Heterojunction Field-Effect Transistor (HFET)", Reprinted from Electronics Letters, vol. 22, No. 15, pp. 784-786, Jul. 17, 1986.

"High Temperature Annealing of Modulation Doped GaAs/AlGaAs Heterostructures for FET Applications" by Lee et al., 1983 IEEE/Cornell Conf. On High-Speed Semiconductor Devices & Ckts, Aug. 1983.

"Submicrometre Gate Length Scaling of Inversion Channel Heterojunction Field Effect Transistor" by Kiely et al., Electronics Letters, vol. 30, No. 6 Mar. 17, 1994.

"Theoretical and Experimental Results for the Inversion Channel Heterostructure Field Effect Transistor" by Taylor et al., IEE Proceedings-G, vol. 140, No. 6, Dec. 1993.

"ZONU Debuts Industry's First Single Fiber, Single Mode Gigabit Small Form Plugable Transceiver", by Alon and Mayer, http://www.expresspress.com/news/zonu_022502.html.

"622Mbps Single Fiber Bi-Directional Optical Transceiver (SFF)", Appointech, Inc. 2003.

"Infineon Introduces Small-Form-Factor Single-Fiber Bi-Directional Optical Transceiver at OFC Conference—Compact New Device Reduces Fiber Cost, Doubles Capacity of Optical Networks With No New Fibers", Infineon Technologies AG, Mar. 19, 2002. http://www.infineon.com/news/press/203_062e.htm.

* cited by examiner

APPARATUS AND A METHOD OF FABRICATING INVERSION CHANNEL DEVICES WITH PRECISION GATE DOPING FOR A MONOLITHIC INTEGRATED CIRCUIT

CROSS REFERENCE TO RELATED APPLICATIONS

This is a DIVISIONAL of application Ser. No. 10/200,967, filed Jul. 23, 2002 now U.S. Pat. No. 6,849,866.

This application is a continuation-in-part of U.S. Ser. No. 08/949,504 filed Oct. 14, 1997 now abandoned which claims priority from provisional application 60/028,576, filed Oct. 16, 1996.

BACKGROUND OF THE INVENTION

1. Technical Field of Invention

This invention relates to the field of semiconductor heterojunction devices and, in particular, to transistors, optical emitters, optical detectors, optical modulators, optical amplifiers and other opto-electronic devices utilizing an inversion channel created by modulation doping.

2. State of the Art

This invention builds upon the existing device structure known as the Pseudomorphic Pulsed Doped High Electron Mobility Transistor (Pulsed Doped PHEMT) and sometimes referred to as the Pulsed Doped Modulation Doped Field Effect Transistor (Pulsed Doped MODFET) or the Pulsed Doped Two Dimensional Gas Field Effect Transistor (Pulsed Doped TEGFET). GaAs/InGaAs/AlxGal-xAs is the III–V material system of choice for these devices because of the ability to grow high optical/electrical quality epitaxial layers by MBE (molecular beam epitaxy). These high frequency transistors are now in constant demand as the front end amplifier in wireless and MMIC applications and they have become well recognized for their superior low noise and high frequency performance.

The use of pulse doping in the HEMT epitaxial structure was first disclosed at the IEEE Cornell conference on high speed devices in August 1983 (Lee 1983), in the context of the GaAs/AlGaAs HEMT device. In that case the heterojunction interface containing the inversion channel was formed between GaAs and AlGaAs materials. In a later publication (Rosenberg 1985), a strained layer of InGaAs was employed at the heterojunction with GaAs both above and below the quantum well. Then in 1987, Morkoc and coworkers patented the Pseudomorphic HEMT structure which is the structure reported by Rosenberg but with the GaAs above the quantum well replaced by $Al_xGa_{1-x}As$.

The pseudomorphic transistor structure has been very successful in producing microwave transistors that operate well into the multi-gigahertz regime, initially being used extensively in military systems and now finding their way into commercial products, particularly in the area of cellular communications. In recent years, there has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser and the MSM or PIN diode. To achieve this goal it has been proposed to change the structure by modifying the growth between the quantum well and the interface to enable an ohmic contact instead of a Schottky contact. (See U.S. Pat. No. 4,800,415 which is hereby incorporated by reference herein in its entirety). In these patents, the PHEMT growth structure is modified in the region between the modulation doping and the semiconductor surface and the doping is proposed to be substantially p type in order to provide a low resistance ohmic contact for the gate of the FET. However, this high doping creates a problem in the formation of the vertical cavity laser because of the effects of free carrier absorption. It also creates a problem in forming depletion type FETs by implanting n type dopant, i.e., compensating a large p density with a large n density to obtain a lower p density is difficult to control in a bulk region but much easier in a delta doped region. It makes control of the enhancement threshold difficult too, because the input capacitance is a function of doping which is harder to control than layer thickness. Another problem with this doping scheme is in producing effective current funneling for the laser to direct the current flow into the region of stimulated emission. It is very desirable to create a pn junction by N type implantation to steer the current in this structure since this would be compatible with the overall approach to building the FET devices. The heavy p doping makes it difficult to create junction isolation that is low leakage.

SUMMARY OF THE INVENTION

It is an object of this invention to provide a semiconductor growth structure which can simultaneously within a single integrated circuit chip be fashioned to operate as a bipolar transistor, a field-effect transistor, a laterally injected laser, a switching laser, a PIN detector, an optical amplifier and a modulator.

Another object of this invention is to devise a fabrication sequence to realize all these components simultaneously in a vertical cavity format for the optoelectronic devices. This fabrication sequence must minimize the number of steps and produce the minimum height final structure to maximize manufacturing yield.

It is a further object of this invention to achieve these goals with a unique combination of planar sheet dopings which modify the generic PHEMT structure and provide it with optoelectronic capability.

An additional object of this invention is to solve the problems of existing optoelectronic devices approaches wherein the vertical cavity laser isolation and parasitic loss and the threshold voltage of the FETs could not be optimized. This invention will provide a manufacturable approach.

A semiconductor device structure and a fabrication technology have been invented to meet these objectives which achieves vertical cavity laser and detector operation and FET operation within the same element. In accordance with one illustrative embodiment of the invention, the structure is utilized in a field effect transistor device called a PHEMT where the gate contact is ohmic in nature as opposed to a Schottky diode. The ohmic contact is non-rectifying whereas the Schottky diode contact is rectifying to applied signals. Between the gate metal and the modulation doped layer of the PHEMT are two planar sheet charge doping layers both of opposite doping type (p type) to the modulation doped layer (n type). The top one at the surface enables a low resistance ohmic gate contact and the lower one, spaced below the top one by a specific thickness of charge neutral and essentially undoped wide bandgap semiconductor material and yet above the modulation doped layer of the PHEMT that creates the inversion channel by a very thin well defined thickness of intermediate bandgap material, to define the input capacitance of the field effect active device with respect to the modulation doped layer. The PHEMT itself is comprised of the modulation doped layer deposited upon a spacer layer of wideband material which is deposited on a small spacer of GaAs and then a series of barriers (GaAs) and wells (In$_x$Ga$_{1-x}$As) all deposited on a sub-layer of GaAs. An additional region of high doping of the same type as the modulation doped layer may be added below the PHEMT structure in the wideband gap waveguide cladding material to produce a pn junction and this enables a thyristor that functions as a laser or a detector.

To form the inversion channel devices, source and drain electrodes are provided on either side of a refractory metal gate/emitter using ion implantation and standard self-alignment techniques. The source and drain electrodes are metalized after a high temperature anneal which activates the implanted species. For the field effect transistor, the gate contact metal forms a uniform metal feature across the length (short dimension) of the device. For the optoelectronic devices (laser, detector, optical amplifier and modulator) the gate metal is opened to allow the passage of light either into or out of the active region and the surface P++ planar sheet doping is relied upon to produce a constant potential across the optical opening. Then the current flow from the gate metal contact into the active layer is a two dimensional funneling mechanism which is enabled by the use of a Si implant to steer the carrier flow. The optoelectronic devices are resonant vertical cavity devices and the spacing between the two planar doping p type layers is adjusted to produce an integral number of half wavelengths in the cavity.

The above embodiment produces optoelectronic devices that emit or detect normal to the surface. In another embodiment, the DBR mirrors of the vertical cavity perform as the cladding layers for a dielectric waveguide, and the light is entered into the edge of the device by means of a passive waveguide fabricated monolithically with these devices. This operation is particularly significant for the detector, modulator and amplifier devices.

Further features and advantages of the invention will become more readily apparent from the following detailed description when taken in conjunction with the accompanying drawings.

BRIEF DESCRIPTION OF THE DRAWINGS

FIGS. 2A–I show the schematic cross-sections of the active device locations on the wafer after selected process steps during the fabrication sequence as follows:

FIGS. 3A–D are schematic cross-sections of the waveguide sections of the wafer at various stages during the fabrication sequence as follows:

DESCRIPTION OF THE PREFERRED EMBODIMENTS

Figure 1A:
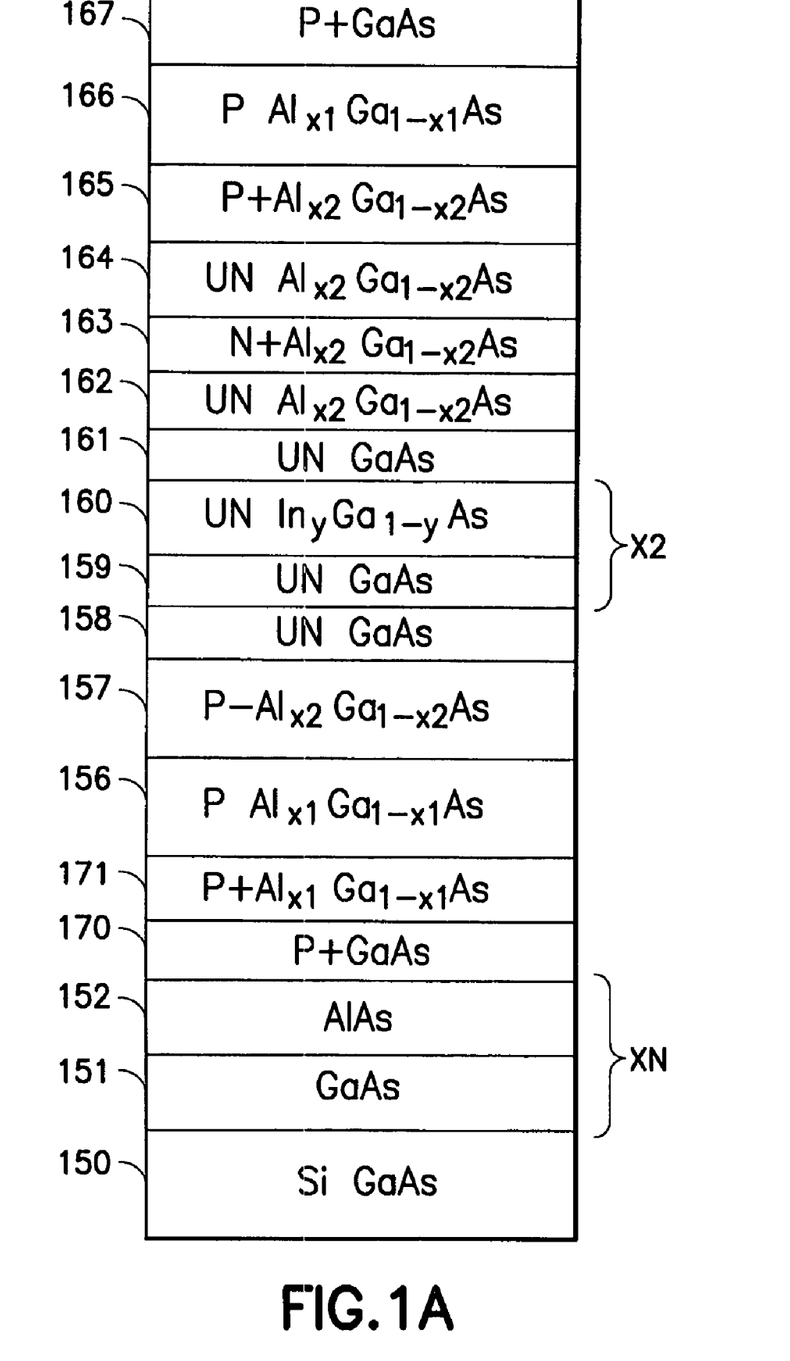
FIG. 1A is a schematic view showing layers of the structure according to the principle embodiment of the invention and from which the electronic and optoelectronic devices of the invention can be made.
Figure 1B:
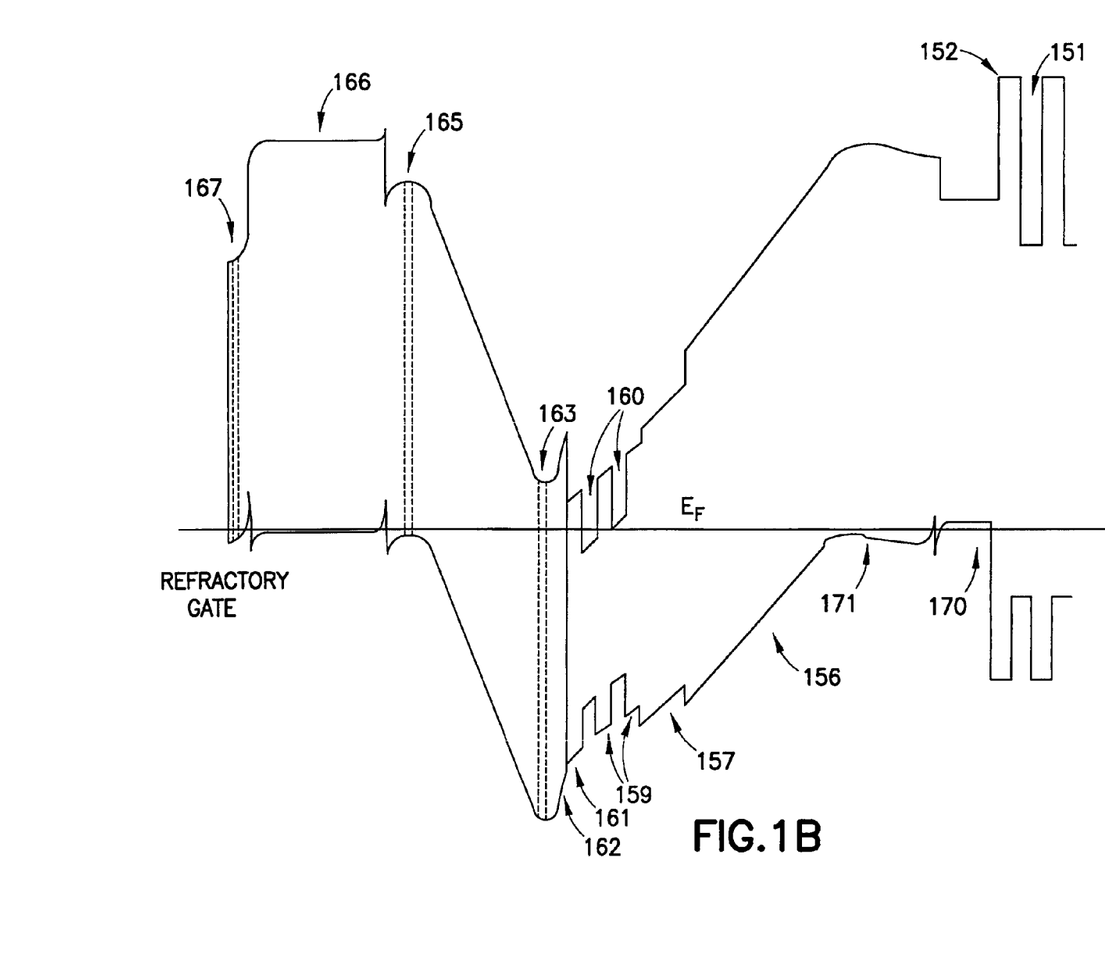
FIG. 1B shows the energy band diagram of the FIG. 1A structure.

FIG. 1A show the vertical layers of a structure in accordance with an embodiment of the invention and from which all the device structures associated with the optoelectronic technology can be made. A first semiconductor layer 151 and a second semiconductor layer 152 are deposited in pairs upon a semiinsulating gallium arsenide substrate 150 in sequence to form a dielectric distributed bragg reflector (DBR) mirror. In the preferred embodiment the AlAs layers will be subsequently subjected to high temperature steam oxidation to produce the compound Al$_x$O$_y$ so that a mirror will be formed at the designed center wavelength. Therefore the GaAs and the AlAs layer thicknesses in the mirror are chosen so that the final optical thickness of GaAs and Al$_x$O$_y$ are ¼ wavelength. Deposited upon the mirror is the active device structure which begins with layer 170 of heavily doped GaAs of about 2000 Å thickness to enable the formation of ohmic contacts. In FIG. 1A this layer is doped P+ type which results in superior performance of the HFET due to an optimized collector contact. In FIG. 1A, layer 171 of P+ type Al$_{x1}$Ga$_{1-x1}$As (typical thickness of 500–3000 Å) is deposited upon the contact layer and this forms part of the lower cladding for the optical devices (an Al percentage of x1=0.7–0.8 and a doping level of ×10$^{18}$ cm$^{-3}$ are typical). Layer 156 of P type Al$_{x1}$Ga$_{1-x1}$As with a doping of 10$^{17-1018}$ cm$^{-3}$ and a thickness of 1000–3000 Å is deposited next. Electrically, this layer forms the collector (the p side of the pn junction) for the transistor and it provides carrier confinement for the laser, amplifier and modulator structures. The combination of Al$_{x1}$Ga$_{1-x1}$As layers 156 and 171 provide the optical cladding function for the lower waveguide for all laser, amplifier and modulator structures. Next layer 157 of Al$_{x2}$Ga$_{1-x2As}$ is deposited in which x2 is 0.15–0.2, the thickness is about 500–1000 Å and the p doping is the background doping of about 10$^{16}$ cm$^{-3}$ which is found in typical epitaxial reactors. This layer forms the lower separate confinement heterostructure (SCM) layer for the laser, amplifier and modulator devices. Next, layer 158 of undoped GaAs is deposited having a thickness of 100–300 Å to form a spacer layer and then quantum wells consisting of undoped well layers 160 (typical thickness of 60–100 Å) and undoped barrier layers 159 (typical thickness of 100 Å). In the illustrated embodiment 3 quantum wells of strained InGaAs are used but unstrained wells are also possible. Above the quantum wells, an undoped spacer layer 161 of GaAs with a thickness of 20–40 Å is deposited. This layer allows the adjustment of the epitaxial growth temperature from 530° C. as required for the growth of strained InGaAs layers to a temperature of 620° C. as desired for optical quality $Al_{x2}Ga_{1-x2}As$ layers. Next, a spacer layer 162 of undoped $Al_{x2}Ga_{1-x2}As$ is deposited of thickness 20–30 Å to perform as a setback layer for the modulation doping. On top of layer 162 there is deposited the modulation doped layer 163 which is also of alloy composition $Al_{x2}Ga_{1-x2}As$ The doping of layer 163 is in the range from $10^{18}$ to $10^{19} cm^{-3}$ and the thickness is in the range of 30–100 Å. In the illustrated embodiment the doping is $3.5 \times 10^{18}$ $cm^{-3}$ and the thickness is 80 Å. This layer is constantly depleted in all useful modes of operation of the devices. The modulation doped layer is followed by the undoped layer 164 of composition $Al_{x2}Ga_{1-x2}As$. This layer serves as the input field effect capacitor layer for all the electronic devices such as the field-effect and bipolar devices. This layer is often referred to as the gate spacer layer in the context of field-effect devices. This layer should be very thin to enable very high frequency operation. In the illustrated embodiment, for a transistor cutoff frequency of 40 GHz, a thickness of 300 Å would be used and for 90 GHz a thickness of 200 Å would be more appropriate. It is noted that the sequence of layers from 157 to 164 inclusive, form the structure referred to as the PHEMT transistor structure. For the optoelectronic device operation, layer 164 is the upper SCH region. Deposited upon layer 164 is a very thin (delta-doped) layer of P+ type $Al_{x2}Ga_{1-x2}As$ which is layer 165. Typical thickness and doping values are 60 Å and $10^{19}$ $cm^{-3}$. The doping species for this layer is preferably carbon (C) to ensure diffusive stability. In contrast to layer 163, layer 165 should never be totally depleted in operation. Layers 165 and 163 form the two plates of a parallel plate capacitor which forms the field-effect input to all devices. This planar Carbon doped layer represents the bottom p type charge sheet that is being added to the PHEMT structure and is essential to the invention Layer 166 is deposited on layer 165 and is the upper waveguide cladding layer for the laser, amplifier and modulator devices. This layer has the composition of $Al_{x1}Ga_{1-x1}As$ with a p type doping level of $10^{17} cm^{-3}$ and a thickness typically of 600–1000 Å Layer 167 is the final layer in the epitaxial growth and is a very thin layer of GaAs of p++ type doping which is doped with the impurity C to extremely high levels to facilitate the formation of a low resistance ohmic contact. Typical values of thickness and doping are 100 Å and $10^{20}$ $cm^{-3}$ respectively. This planar doped Carbon layer represents the top p type charge sheet that is being added to the PHEMT structure and is also essential to the invention. The band diagram of the FIG. 1A structure is shown in FIG. 1B.

To form resonant cavity devices, a dielectric mirror is deposited on this structure during the fabrication process. The distance between the mirrors is the thickness of all layers from 153 to 167 inclusive. In designing this structure, this thickness should represent an integral number of ½ wavelengths at the designated wavelength and the thickness of layer 166 is adjusted to enable this condition. The structure of FIG. 1 can be made, for example, using known molecular beam epitaxy techniques.

Figure 2A:
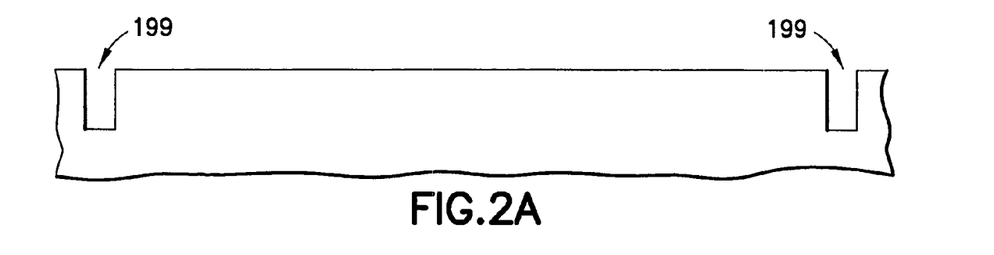
FIG. 2A—after definition of alignment marks.
Figure 2B:
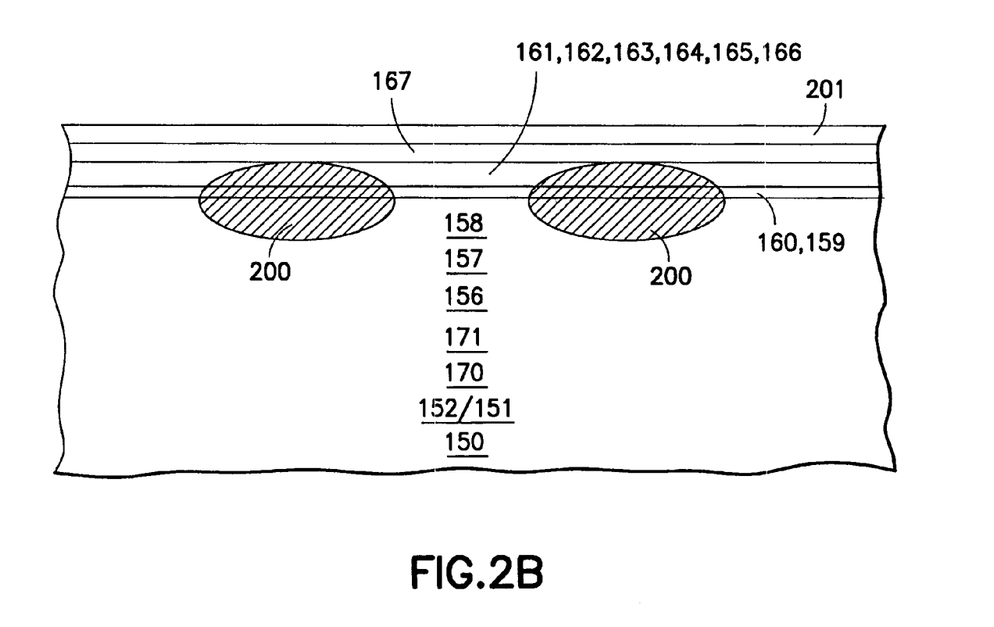
FIG. 2B—after the N type implant to define the optical aperture.
Figure 2C:
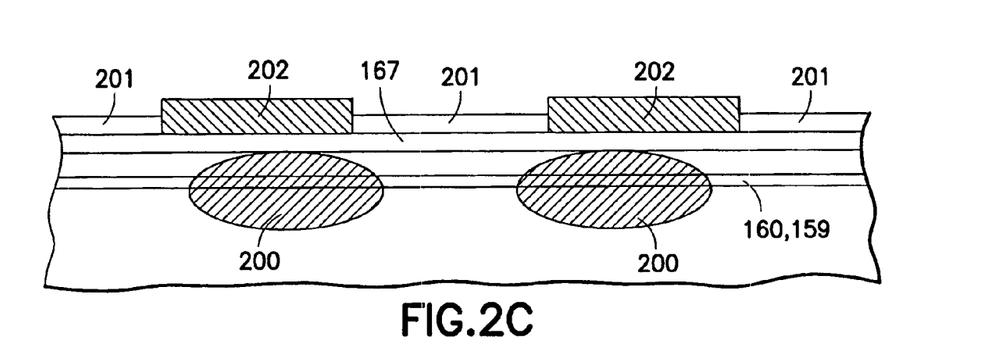
FIG. 2C—after lift-off of refractory (tungsten ->W) electrodes.
Figure 2D:
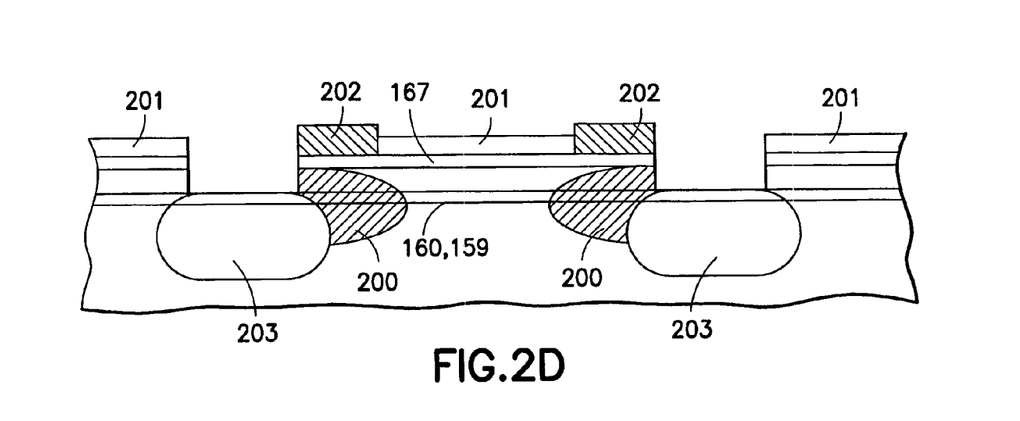
FIG. 2D—after W gate definition and etch and Si ion implant to form source and drain regions.
Figure 2E:
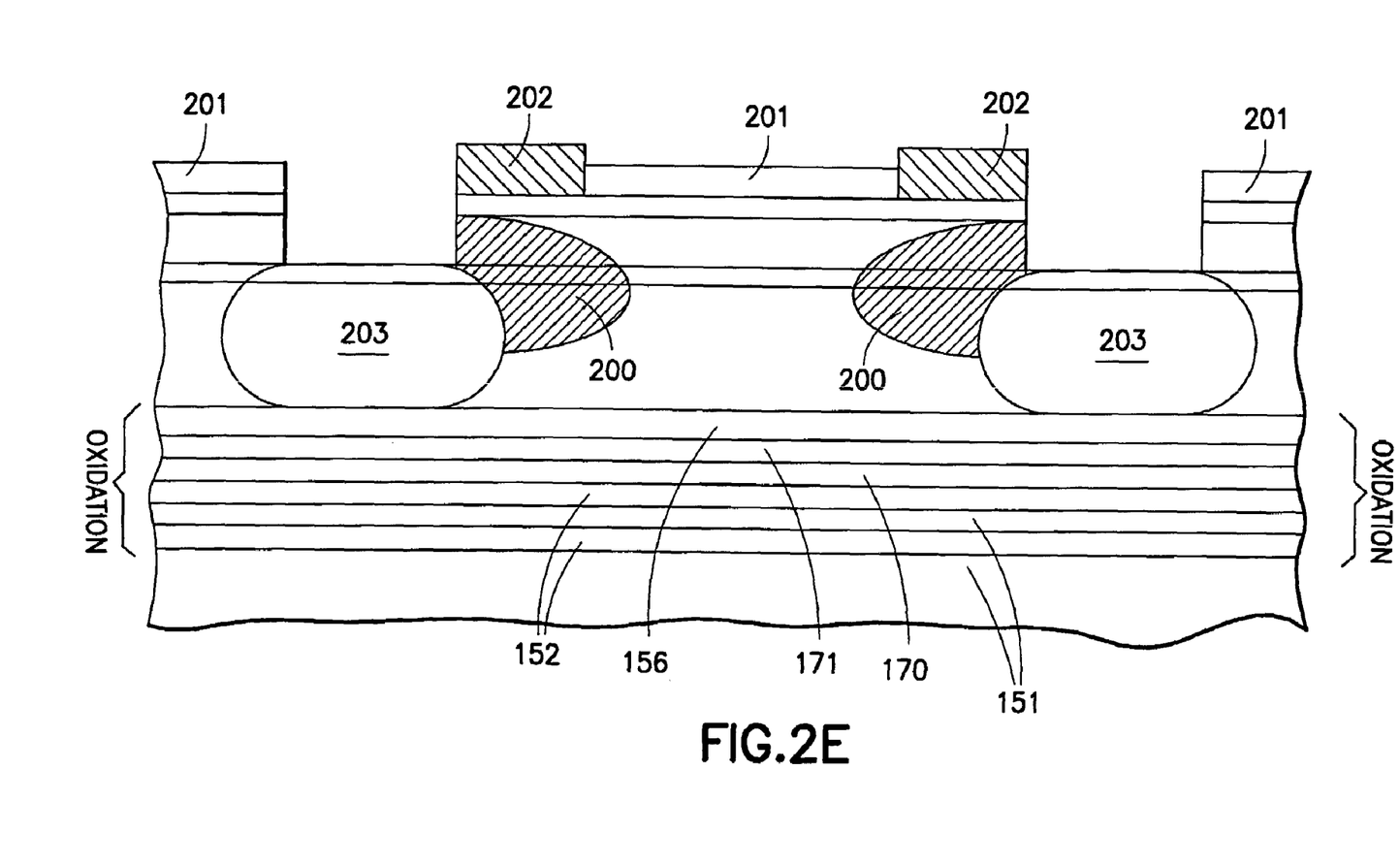
FIG. 2E—after definition and etch of trench feature to expose DBR stack for oxidation.
Figure 2F:
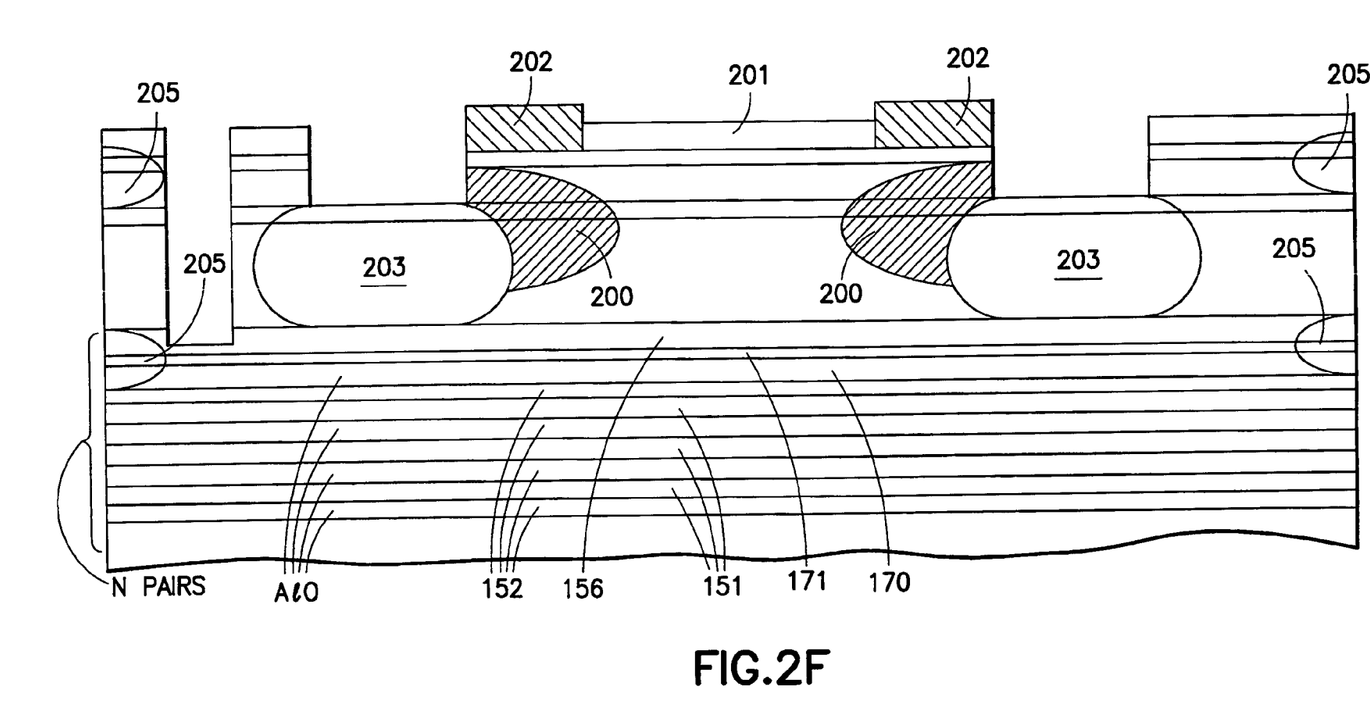
FIG. 2F—after definition and etch of collector contacts.
Figure 2G:
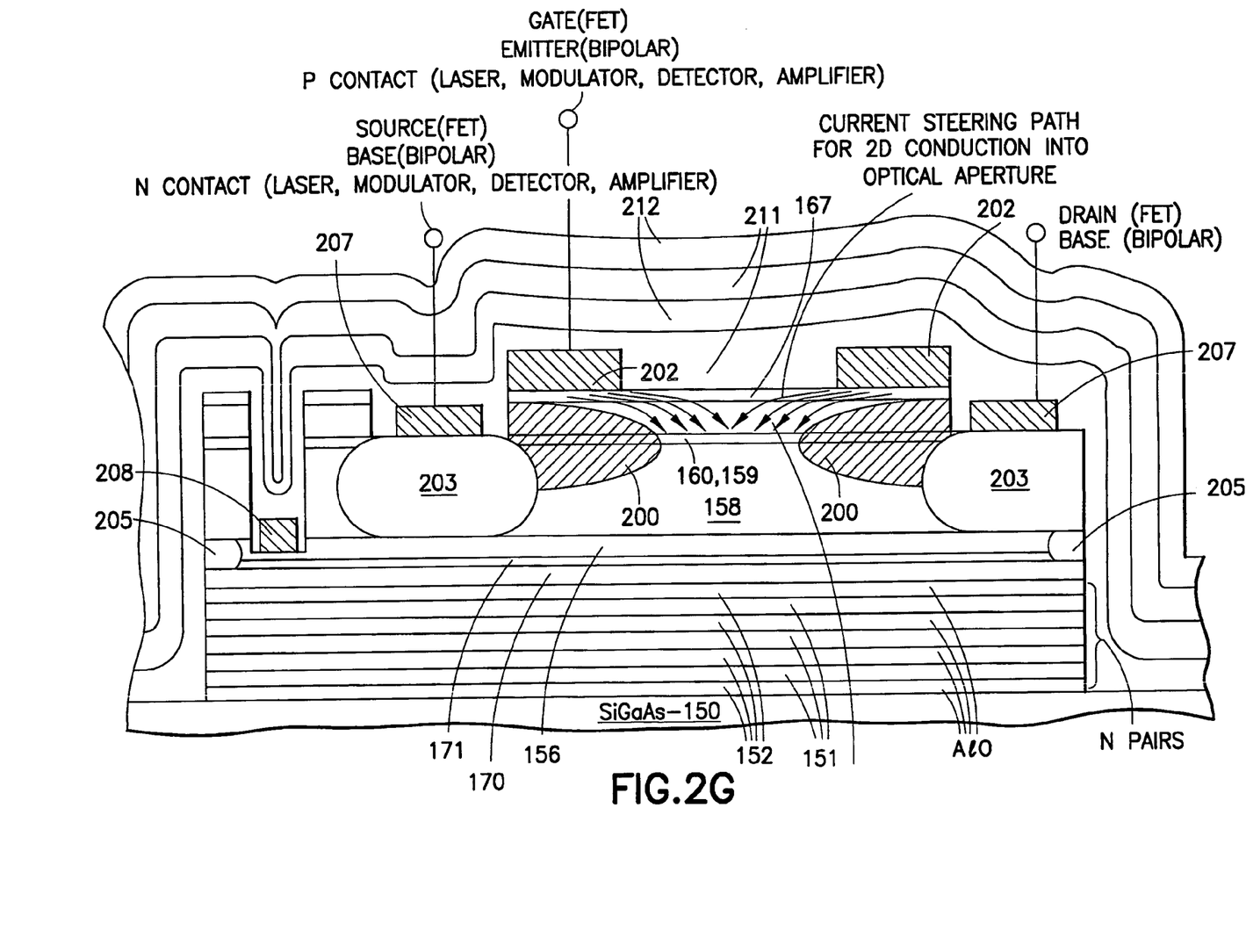
FIG. 2G—final fabricated cross-section for the HFET optoelectronic device family which includes the HFET laser, the HFET detector, the HFET amplifier, the HFET modulator and the HFET directional coupler.
Figure 2H:
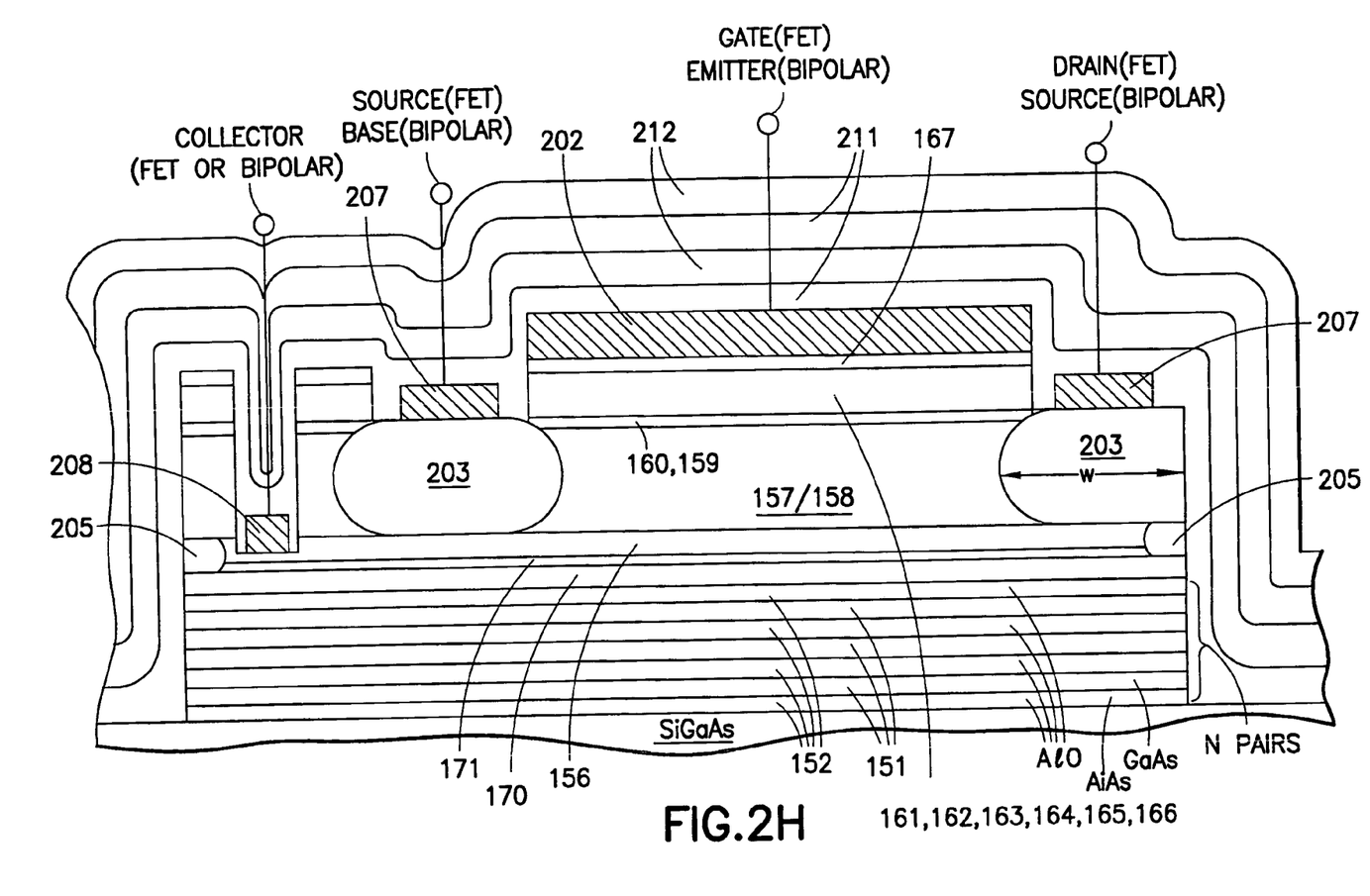
FIG. 2H—final fabricated cross-section for an enhancement type HFET transistor.
Figure 2I:
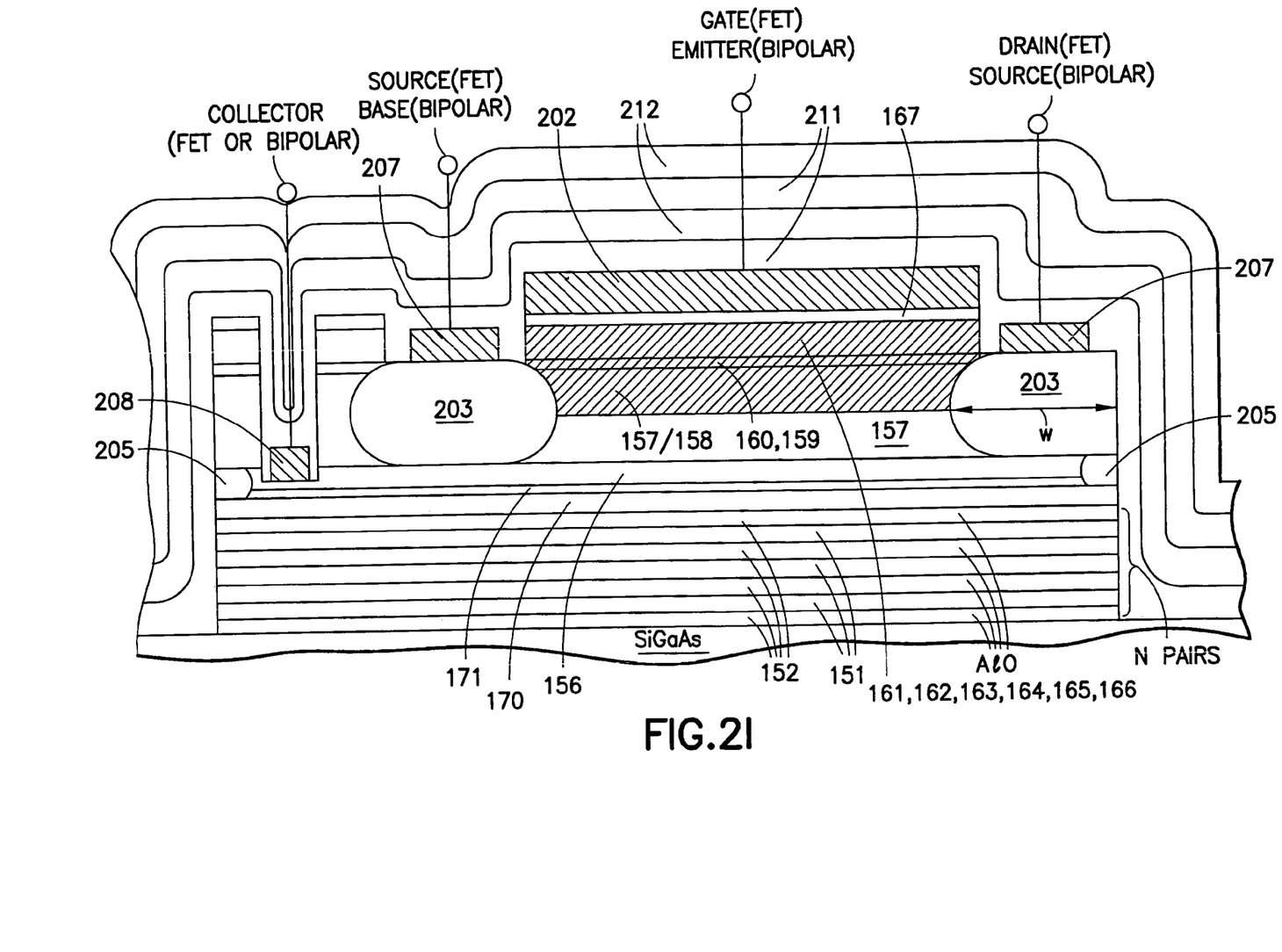
FIG. 2I—final fabricated cross-section for a depletion type HFET transistor.

Using the structure as set forth, optoelectronic devices and transistors can be made in accordance with the sequence of steps shown in FIGS. 2A–H. Device fabrication begins with the formation of (horizontal) alignment marks 199 by wet or dry etching. A dielectric layer 201 (e.g., of Si3N4 or Al2O3) is deposited over the entire surface. Then the FET depletion threshold voltages and the current steering functions in the optoelectronic devices are defined by the N type implant 200 in FIG. 2B which penetrates the dielectric (Si3N4). This implant is both horizontally and vertically placed to optically confine the vertically propagating mode which it does in two ways. The first function of this implant is to guide electrical p type carriers from the refractory gate contact 202 into the section of active channel of layers 160, 159 that are positioned between the implants 200 and this is indicated by the arrows in FIG. 2G which show the conduction path. The arrows indicate a two dimensional conduction path for positive carriers. The major portion of implant 200 lies in the regions 166, 158, 157 which are the wide bandgap cladding layers. For gate to source voltages less than the built-in voltage (typically 2V) of these layers, there will be no conduction into regions 200 but instead the carriers will be funneled into the active layer along the current steering path as defined by the arrows. Therefore the implants allow the metal contact to be displaced away from the optical aperture, so that in the case of the laser for example, photons can only be produced in the quantum well section between the implants. Second, the implanted sections are slightly lower in index so that optical propagation in the cavity is guided into the region between the implants. Then in the next step, the optical apertures of the lasers, detectors and modulators are defined with photoresist and nitride layer 201 is etched and refractory metal 202 (such as tungsten) is lifted off into the openings to form the gate metal pattern. Alternatively, if the nitride dielectric is sufficiently thick to block a source-drain implant, then lift-off of the refractory metal may be avoided by using a direct patterning procedure for the gate (emitter) metal. FIG. 2C shows the wafer at this step. This opening is made somewhat larger than the implant separation to minimize the effects of optical scattering at the metal edges. The next photomask defines the gate metal feature by protecting the metal with photoresist where a feature is desired and etching the refractory metal. This metal feature 202 is a multifunctional electrode since it serves as the p type contact for the bipolar type transistors, for the FET type transistors, for the laterally injected laser, and for the laterally connected detector, amplifier or modulator. These electrodes have been labeled in FIG. 2G. Where there is no optical opening, a field-effect transistor is obtained and where there is an opening an optoelectronic device is formed. The photoresist may protect regions of W or of $Si_3N_4$ which are shown in FIG. 2C. With the photoresist still in place, N type ions are implanted to create regions labeled 203 thereby forming low resistance contacts which are self-aligned (horizontally) to the inversion channel by the nature of the construction. The impurity type of the implant is N+ in order to supply I electrons to the channel since the modulation doped layer 163 is also N type. FIGS. 2D and E show that where the W is patterned a gate feature results and where the $Si_3N_4$ was patterned it remains as a protective coating. These $Si_3N_4$ regions which are shown on either side of the channel contact regions in FIG. 2E are used to make contacts to the collector regions. After removal of photoresist, the wafer is then subjected to a rapid thermal annealing procedure which typically consists of a temperature of 950° C. for a time of 10 sec. This anneal has two functions which are to activate all ion implants and to perform disorder of selected areas in the formation of waveguides. To achieve selective disorder, we replace sections of the nitride ($Si_3N_4$) with oxide ($SiO_2$) and this is described later in the discussion of waveguide fabrication. The next step is to pattern the wafer to protect all active devices to enable a deep etch. Then etching is performed down to the semi-insulating GaAs substrate and the sample is oxidized in a steam ambient to convert the mirror layers 152 of AlAs to mirror layers 152 of $Al_xO_y$. During this step there is also lateral oxidation of $Al_{x2}$ layers to create oxide regions 205 which provides passivation of sidewall layers. However the collector contact regions remain unoxidized. Following the oxidation, holes are etched to the collector layers. This cross-section is shown in FIG. 2F. All of the N type regions are then contacted with N type alloy metals (e.g., AuGe/Ni/Au) 207 and all of the P type regions are contacted with P type alloy metals (e.g., AuZn/Cr/Au) 208. It is noted that the N type implant 203 atop which metal 207 sits should extend up to or above the quantum well layers 159, 160, while metal 208 should sit on a P or P+ type layer (e.g., any of layers 170, 171, 156 or 157) located below the quantum well layers. Both the N type and P type alloy metals may be deposited by lift-off techniques. In this metalization technique, openings are patterned in photoresist and the Au metal is deposited on the resist and in the openings. However other types of metal patterning which do not require lift-off (e.g., metallization followed by photoresist deposition, and etching) are also possible and preferred to enhance yield in a manufacturing process. Then polyimide dielectric isolation is applied, contact holes are formed and lift-off of gold interconnect patterns is performed which also defines bonding pads. The final step is the deposition of the upper dielectric, preferably in the form of a mirror comprised of alternating layers 211 and 212 as shown in FIG. 2G, FIG. 2H, and FIG. 2I. These layers would be formed with a low refractive index material such as $SiO_2$ for layer 211 and a high refractive index material such as GaAs (or Si) for layer 212. Holes would then be etched through these layers to make contact to the bonding pads.

At this stage several different types of devices have been created and these are shown by the final cross-sections in FIGS. 2G–I. FIG. 2G shows the cross-section of the HFET laser, the HFET detector, the HFET optical amplifier and the HFET modulator. It is to be emphasized that the identical structure performs as all of these devices depending upon the biases applied to the terminal nodes. One important device is the laterally injected vertical cavity surface emitting laser (VCSEL). In the operation of the laser, there is a strong forward bias (e.g., preferably >2V) applied between the gate (202) and the source (207) terminals so that the electrons from the source populate the channel simultaneously with holes injected from the gate and lasing takes place either as a vertical cavity device or as an edge emitter. For the vertical cavity operation, the cavity is formed by the top and bottom DBR mirrors as already described whereas for the edge emitting operation, the cavity is formed by cleaved facets. However, if the reflectivity of the device as an edge emitter is made very small (e.g., <0.1%), then the operation of an optical amplifier is obtained. On the other hand if a moderate forward bias is applied (e.g., preferably <1.8V and preferably >0V) only electrons populate the channel and then the device performs as a modulator with a high on/off ratio. The optical amplifier also can be considered to perform as a modulator in which there is internal gain to compensate for the insertion and absorptive losses of the device. If the source (207) and gate (202) terminals are reverse biased then electron and holes in the channel are separated to the source and drain respectively and the device is a detector with either resonant cavity features or waveguide features. What has been accomplished is to adapt the electrode potentials of the source (207), gate (202) and collector (208) terminals so that when light is admitted through the top DBR mirror and the optical aperture formed by the ion implant 200 or through the bottom DBR mirror, then resonant absorption may take place in the quantum well inversion channel resulting in the production of electron-hole pairs such that the electrons are conducted to the source contacts (207), and the holes are conducted to the gate contact (202) or the collector contact (208) depending upon the relative potentials of the collector and the gate. With this operation we obtain the function of the resonantly enhanced optical detector since the absorption in a single quantum well is greatly increased by the cavity resonance. In this case only, the metal gate and collector can be contacted as one electrode and and source/drain contacts as a second electrode. In this situation the trench etch (dimension z in FIG. 2G) can be made as narrow as possible to reduce the area (dimension W) allocated for the source and drain contacts. The advantages are reduced capacitive loading of these two junctions and the ability to oxidize the $Al_{0.7}$ regions under a substantial portion of the implanted junction to further reduce the diode capacitance.

In FIG. 2H and FIG. 2I, the cross-section for the FET device is shown; for the enhancement device of FIG. 2H, without the implant 200, and for the depletion device of FIG. 2I with the implant 200. The HFET is the fundamental device produced by this technology and is unique because it employs an ohmic gate contact with a modulation doped structure. The source, drain and gate contacts are used conventionally and the collector is connected as a back gate similar to the substrate contact in a Si MOSFET transistor. In this case, the collector contact, the source and drain contacts and the gate contact are required. The drain dimension is minimized by the trench etch to reduce capacitance. If the source and gate potentials are maintained less than about approximately 1.8V which is the cut-in voltage of the thermionic conduction from the emitter to the collector then the operation is limited to that of the field effect transistor. This structure also functions as a bipolar transistor by using the "gate" metal electrode (202) as an emitter terminal, the two "source" electrodes (207) on either side of the channel as the control terminal (this is the base in a conventional bipolar transistor), and the collector electrode (208) as the traditional collector terminal in a bipolar transistor. When the emitter to collector voltage is increased above the threshold for thermionic emission over the modulation doped barrier, then bipolar transistor action is obtained whereby the injection of current into the control terminal modulates the thermionic current between the emitter and the collector. This bipolar device eliminates the conventional neutral base region and replaces it with an inversion channel. The advantages are the elimination of recombination and scattering in the base region and the base transit time.

Figure 3A:
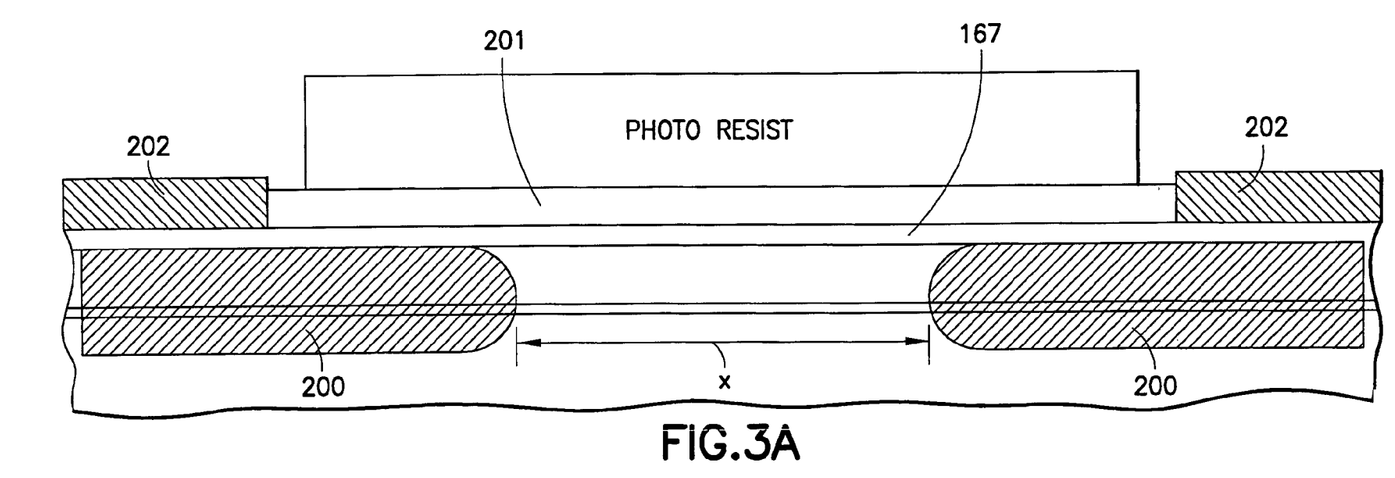
FIG. 3A is a schematic cross-section just before the etching of tungsten with the photoresist mask in place.
Figure 3B:
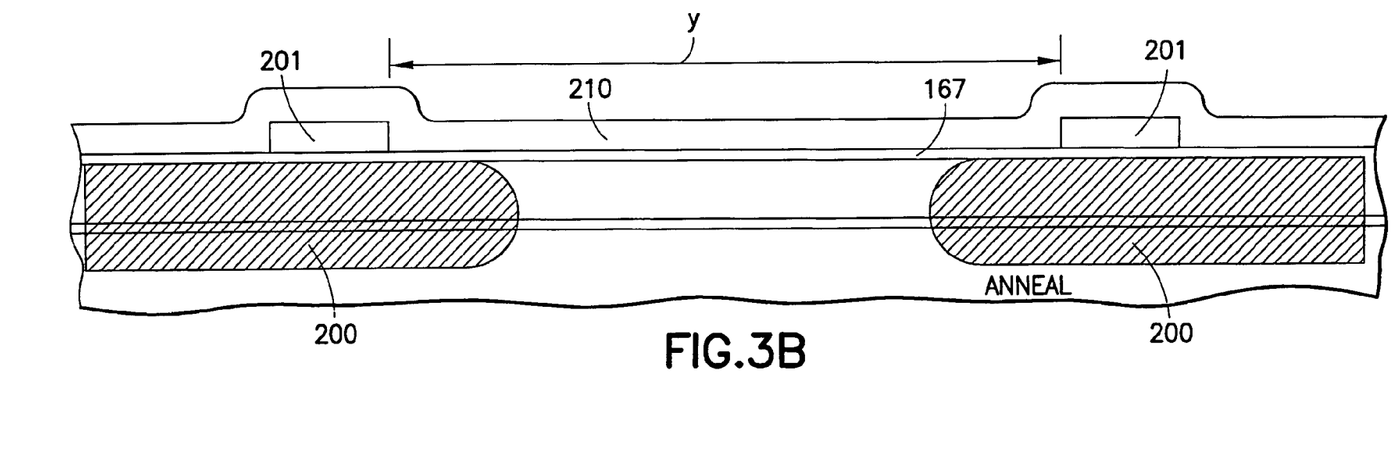
FIG. 3B is a schematic cross-section after a window has been etched in the Si$_3$N$_4$ and SiO$_2$ deposited for the purposes of vacancy free disordering.
Figure 3C:
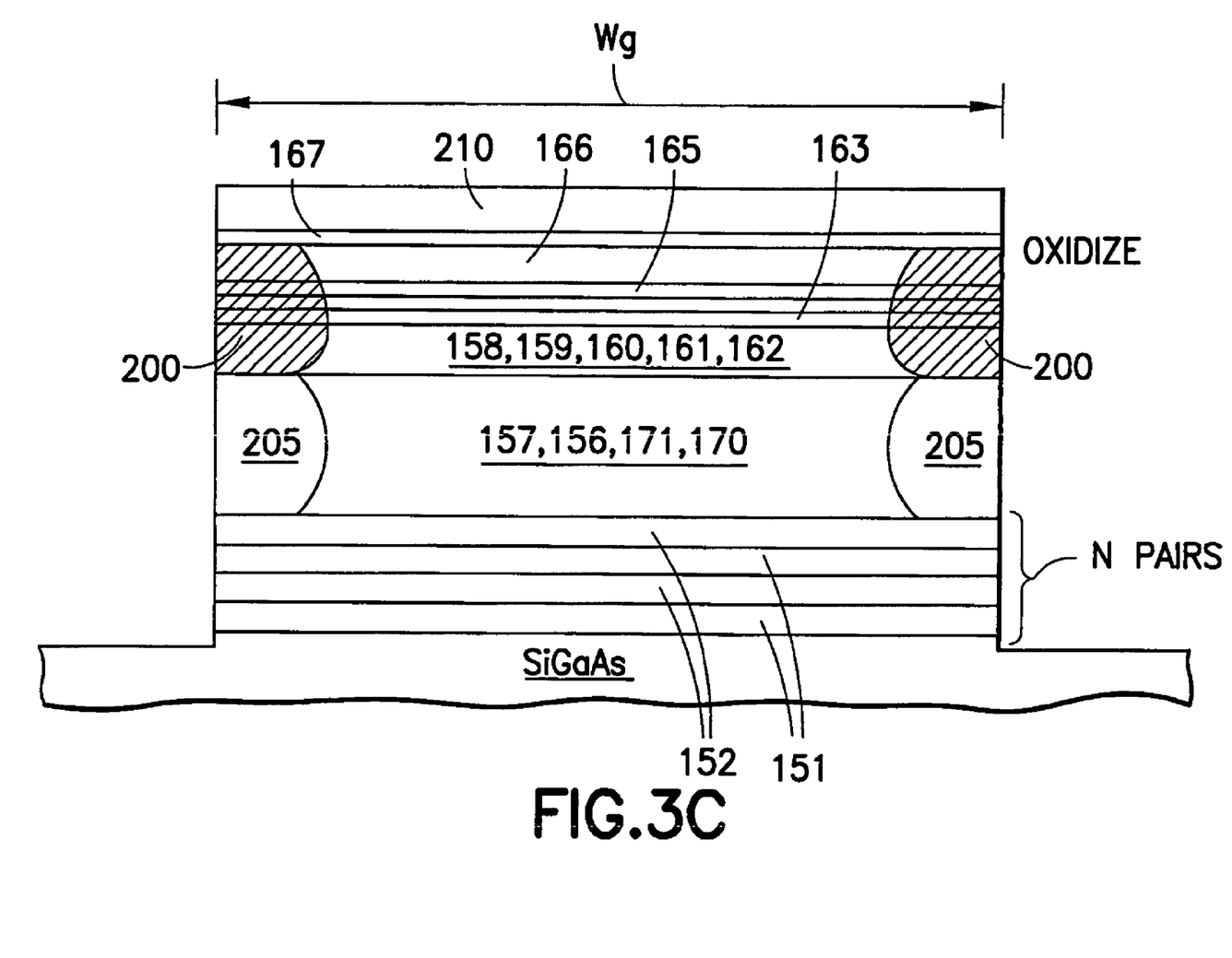
FIG. 3C is a schematic cross-section after the trench etch for the purpose of lateral oxidation of the mirror layers under the waveguide.
Figure 3D:
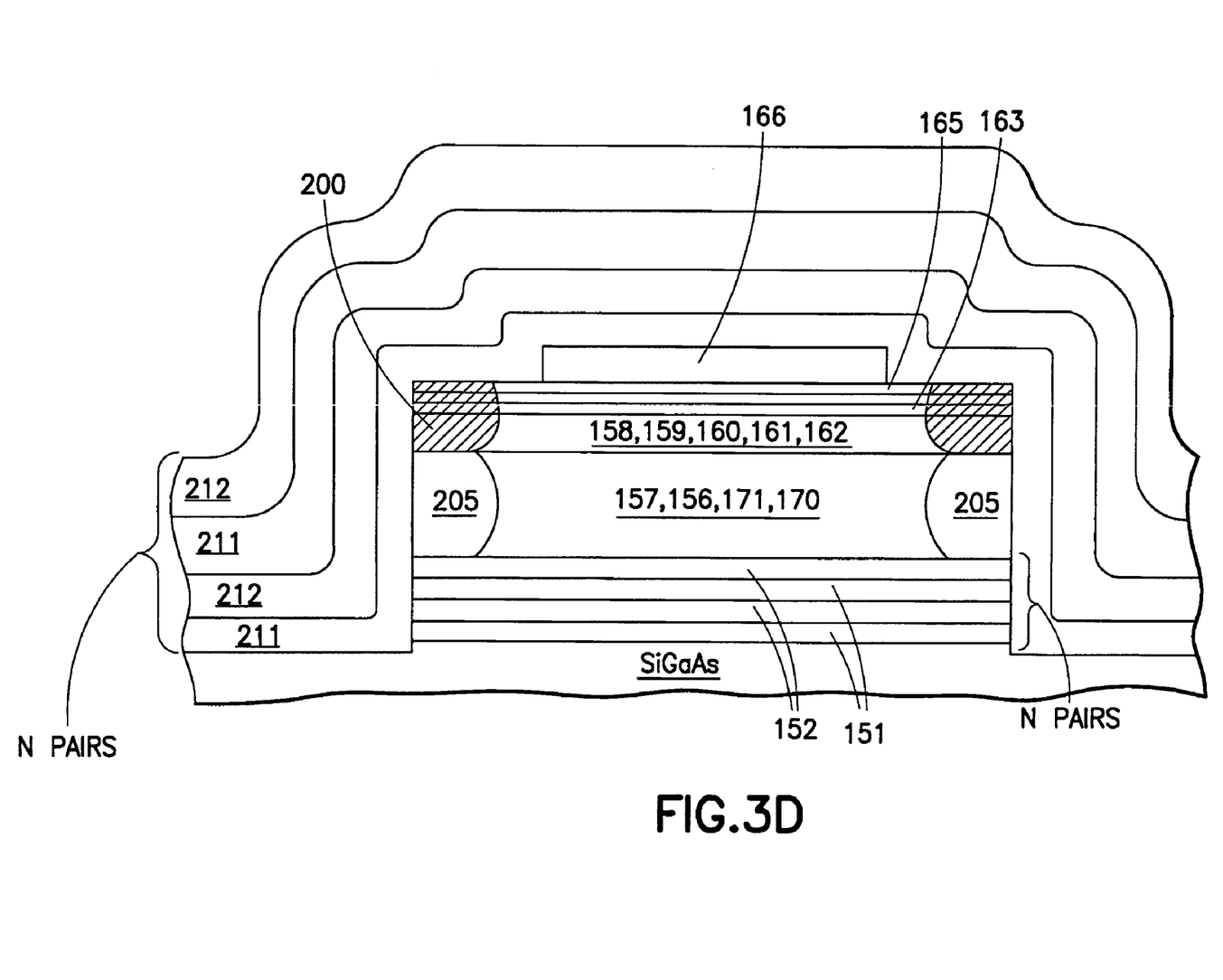
FIG. 3D is a schematic cross-section after the final top mirror has been deposited over the structure.

The same fabrication procedure produces waveguides as shown in FIGS. 3A–D. FIG. 3A shows the cross-section after the lift-off of refractory metal 202 (symbol W for tungsten is used here) but before etching it. The implants 200 used in the active devices and shown in FIG.2B are also used here to provide optical confinement in the waveguide core. The spacing between the implants (206) will be slightly larger than the final waveguide pattern. In FIG. 3B, the waveguide area has been defined by etching the nitride region 201 and $SiO_2$ layer 210 has been deposited to cover the waveguide core region x and the regions external to the waveguide y where the W was etched away. However, it is important to note that y is larger than the final waveguide dimension. The final waveguide dimension wg will be placed inside this region such that x<wg,y. The other function for this mask is to define the waveguide transition region within the active waveguide switching device which functions as the directional coupler. This coupler is the active device which controls the evanescent coupling between two adjacent waveguides. The two waveguides within the coupler are separated by this pattern. The next step is the rapid thermal anneal during which the regions covered with $SiO_2$ experience Impurity Free Vacancy Disordering (IFVD) which increases the bandgap locally to eliminate absorption in the guided region and the regions covered with $Si_3N_4$ (201) show essentially no effects of IFVD. FIG. 3C shows the waveguide after the trench etch and the oxidation which shows the outer extremities of the guide which are formed by the air interface. However the main guiding action is achieved by the presence of the oxidized $Al_xO_y$ sections produced by lateral oxidation during the oxidation procedure and by the implanted regions 200 or 203 as discussed above. At this stage, the $SiO_2$ and the $Si_3N_4$ are removed and the P+ surface layer 167 is etched away. Then the final waveguide pattern is used and the material outside the waveguide core is etched down to the P+ charge sheet layer 165. Therefore the etch is stopped a distance of 300–400 Å above the quantum wells in which the maximum optical intensity resides. After this, the dielectric DBR dielectric layers 211 an 212 are applied in the form of a stack as a final waveguide cladding layer. Note that the polyimide layer is not to be used in the waveguide structure. Thus the final waveguide is a double ridge structure in which a shallow rib of the order of 1000 Å defines the internal core dimension and a much larger rib of depth about 2 μm defines the outer extremities of the guide. By design very little of the optical energy will penetrate to the external boundaries.

There has been described and illustrated herein a layer structure and methods for fabricating an integrated circuit device which allows for one or more of FET and bipolar transistors, optical emitters, optical detectors, optical modulators, optical amplifiers and other opto-electronic devices utilizing an inversion channel created by modulation doping. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. In particular, any combination of III–V materials is possible in which a quantum well with a narrow band gap may be grown epitaxially with surrounding layers of larger band gap all lattice matched to a starting substrate. For example if the quantum wells are GaAs (and the barriers are AlGaAs) then the wavelength is around 850 nm whereas if the quantum wells are grown as InGaAs layers with compressive strain and the barriers are GaAs, then the wavelength may be varied from 920 nm to 1.1 microns (980 nm being typically used as the pump source for erbium doped fiber amplifiers) depending upon the percentage of In incorporated in the growth. As the In content is increased, the maximum or critical thickness of the quantum well layer to avoid relaxation decreases. At the same time the energy gap of the layer decreases and the emission wavelength increases. Another possibility for lattice matched material is obtained by incorporating some percentage of nitrogen (N) into the InGaAs layer to produce a layer of InGaAsN. It has been recently demonstrated that small amounts of N of the order of 2–5% may be incorporated to replace a similar fraction of the As atoms and thereby result in a reduction of the energy gap and thus an increase in the emission wavelength. Lasers with a wavelength of 1300 nm have been demonstrated and it is predicted that wavelengths up to 1600 nm are possible with the right combination of In (reduction of Ga) and N (reduction of As) and the appropriate degree of strain. The strain may be either compressive which tends to increase the wavelength or tensile which tends to decrease the wavelength. These combinations allow the implementation of the optoelectronic device family described above with emission and detection at the commercially important wavelength of 1500 nm. Thus it enables the formation of modulators, switches, detectors, amplifiers and lasers together with FET electronics all at the wavelength of 1500 nm. Another example of an important material system in which this device family could be realized is GaN. Ideally one could start with a GaN substrate to set the proper lattice parameter. However, because of cost and difficulty, various alternatives have been developed including sapphire and SiC substrates. Assuming that the substrate is reasonably well matched, it is then possible to grow double heterostructures consisting of AlGaN for the cladding layers, GaN for the SCH layers and InGaN for the quantum well layers. Various other combinations can be considered.

Additionally, while particular formation and metalization techniques have been described, it will be appreciated that the described structures can be formed in other manners, and other metals used to form terminals. Further, while particular arrangements of bipolar and FET transistors, optical emitters, detectors, modulators, amplifiers, etc. formed from the described semiconductor structure have been described, it will be appreciated that other devices may be formed from the provided structure and components. Moreover, while the invention was described as providing a monolithic layer structure from which different semiconductor elements can be implemented together, it will be appreciated that the invention pertains to utilizing the layer structure regardless of whether a chip utilizing the structure utilizes only a single technology (e.g., FETs), or whether multiple technologies (e.g., lasers, detectors, optical amplifiers, modulators, FETs, and bipolar transistors) are utilized together on the chip. At the same time, while the drawings only show a single element, it will be appreciated that chips utilizing the invention may include millions of horizontally laid-out elements, including one or more of the listed technologies. It will therefore be appreciated by those skilled in the art that yet other modifications could be made to the provided invention without deviating from its spirit and scope as claimed.

The invention claimed is:

1. A method of generating a semiconductor device, comprising the steps of:
   providing a substrate;
   epitaxially growing a structure having a series of layers on said substrate, said epitaxial layers including a modulation doped quantum well structure, at least one P-type doped layer between said substrate and said modulation doped quantum well structure, and at least one P-type doped layer above said modulation doped quantum well structure; and implanting N type ions into said series of layers to produce a pn junction which forms a current steering path and two dimensional conduction for positive carriers into an active area of the structure.

2. A method according to claim 1, wherein:

said structure includes first distributed bragg reflector (DBR) mirror layers below said modulation doped quantum well structure, and second DBR mirror layers atop said modulation doped quantum well structure.

3. A method according to claim 2, further comprising:

etching said layers to expose said first DBR mirror layers; and oxidizing said first DBR mirror layers.

4. A method according to claim 1, further comprising:

defining and etching at least one first contact area to said at least one P-type doped layer between said substrate and said modulation doped quantum well structure;

defining second contact areas above said implanted N type ions;

defining at least one third contact area electrically coupled to said modulation doped quantum well structure; and metallizing said at least one first contact area, said second contact areas, and said at least one third contact area.

5. A method according to claim 4, further comprising:

rapid thermal annealing of said implantation to activate and to perform disordering of selected areas.

6. A method according to claim 1, wherein:

said modulation doped quantum well structure includes an undoped spacer layer formed above at least one quantum well, and an n-type modulation doped layer formed above said undoped spacer layer.

* * * * *